(12) United States Patent
Hayashi

(10) Patent No.: US 11,581,445 B2
(45) Date of Patent: Feb. 14, 2023

(54) OPTICAL SENSOR AND METHOD FOR MANUFACTURING SAME

(71) Applicant: FUJITSU LIMITED, Kawasaki (JP)

(72) Inventor: Kenjiro Hayashi, Hadano (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 17/365,473

(22) Filed: Jul. 1, 2021

(65) Prior Publication Data

US 2022/0140163 A1 May 5, 2022

(30) Foreign Application Priority Data

Nov. 5, 2020 (JP) .............................. JP2020-184853

(51) Int. Cl.
*H01L 31/0352* (2006.01)
*H01L 31/18* (2006.01)
*H01L 31/028* (2006.01)

(52) U.S. Cl.
CPC ...... *H01L 31/03529* (2013.01); *H01L 31/028* (2013.01); *H01L 31/1804* (2013.01)

(58) Field of Classification Search
CPC ............. H01L 31/03529; H01L 31/028; H01L 31/1804; H01L 31/036; H01L 31/09; H01L 31/1136; Y02P 70/50
See application file for complete search history.

(56) References Cited

U.S. PATENT DOCUMENTS

| | | | |
|---|---|---|---|
| 11,264,417 B2* | 3/2022 | Sato ...................... | H01L 31/036 |
| 2014/0057425 A1* | 2/2014 | Afzali-Ardakani .......................... | H01L 29/66037 257/E21.209 |
| 2018/0106933 A1* | 4/2018 | Chanda .................... | H01L 31/09 |
| 2019/0051763 A1* | 2/2019 | Shimatani ........... | H01L 27/1446 |
| 2019/0097000 A1* | 3/2019 | Berry ................ | H01L 21/02527 |
| 2019/0195809 A1* | 6/2019 | Agarwal ............... | C01B 32/194 |
| 2019/0386167 A1* | 12/2019 | Shimatani ........... | H01L 27/1446 |
| 2020/0052146 A1* | 2/2020 | Ogawa .................... | H01L 31/09 |
| 2020/0152679 A1* | 5/2020 | Sato ....................... | B82Y 10/00 |
| 2020/0264038 A1* | 8/2020 | Shimatani ................. | G01J 1/42 |

(Continued)

FOREIGN PATENT DOCUMENTS

| | | |
|---|---|---|
| JP | 2013-046028 A | 3/2013 |
| JP | 2014-203929 A | 10/2014 |
| JP | 2019-522348 A | 8/2019 |

OTHER PUBLICATIONS

Safaei, A. et al. "Dirac plasmon-assisted asymmetric hot carrier generation for room-temperature infrared detection", Nature Communications, 10, 3498 (7 Pages Total), (2019).

(Continued)

*Primary Examiner* — Earl N Taylor
(74) *Attorney, Agent, or Firm* — ArentFox Schiff LLP

(57) ABSTRACT

An optical sensor includes a graphene layer, a first electrode and a second electrode that are connected to the graphene layer, and an enhancement layer. The enhancement layer is disposed below the graphene layer to enhance the intensity of an optical electric field by surface plasmon resonance. The first electrode and the second electrode are arranged parallel to a first direction. The intensity of the optical electric field enhanced by the enhancement layer is greater on a first electrode side than on a second electrode side with respect to a centerline in the first direction of the graphene layer.

15 Claims, 19 Drawing Sheets

(56) References Cited

U.S. PATENT DOCUMENTS

2020/0395499 A1* 12/2020 Ogawa ............ H01L 31/022408
2021/0210643 A1*  7/2021 Shimatani ......... H01L 27/14616
2022/0140163 A1*  5/2022 Hayashi ............. H01L 31/1804
                                                          257/436

OTHER PUBLICATIONS

Safaei, A. et al. "Wide Angle Dynamically Tunable Enhanced Infrared Absorption on Large-Area Nanopatterned Graphene" ACS Nano 2019, 13, pp. 421-428, (2019).

* cited by examiner

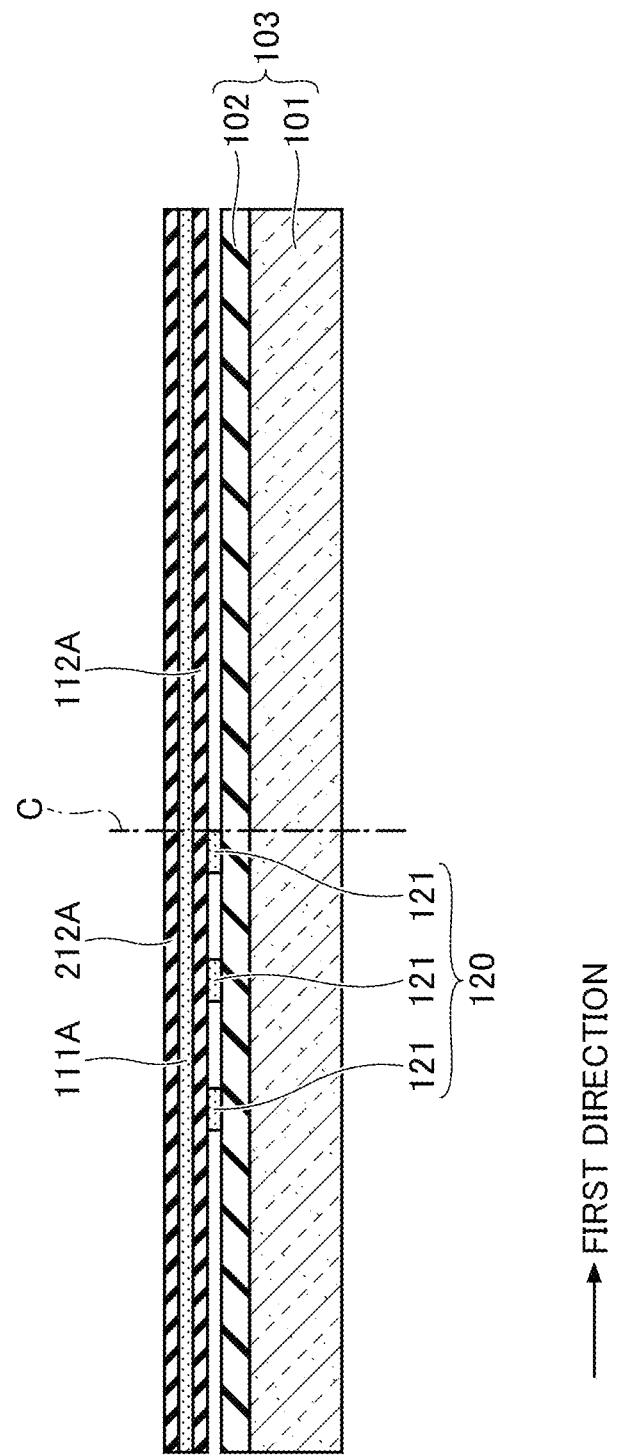

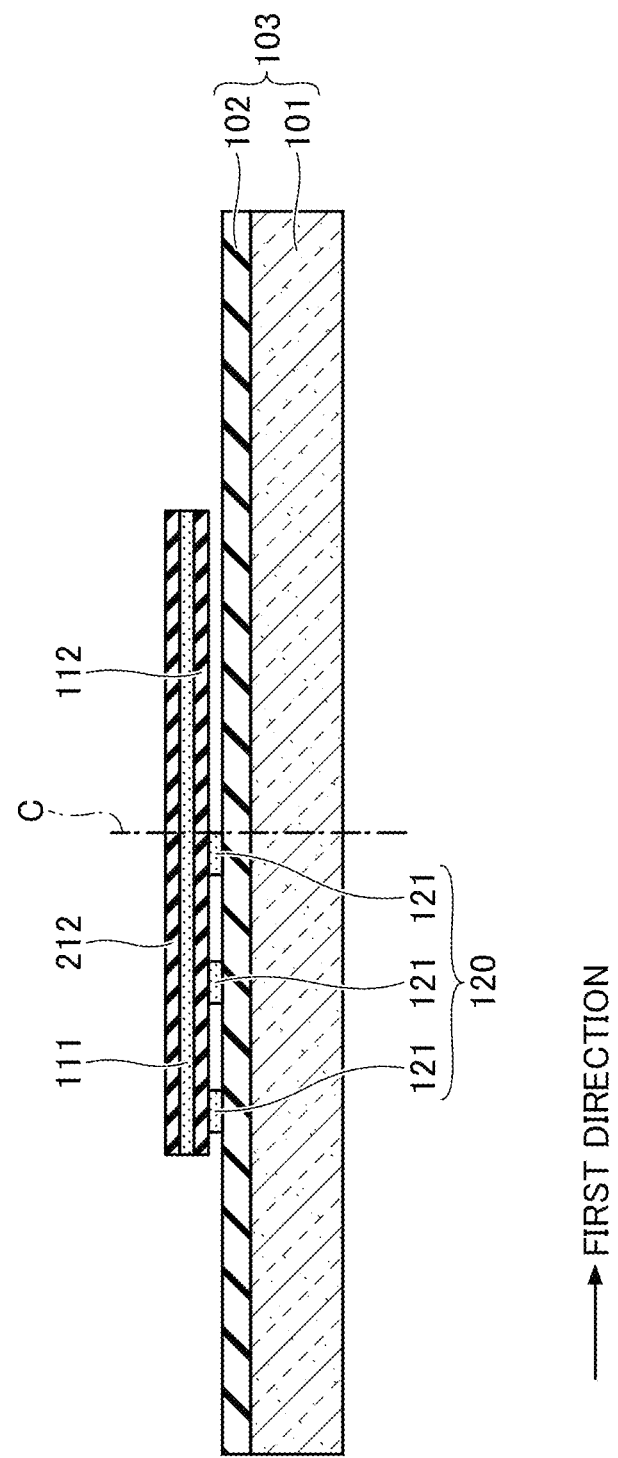

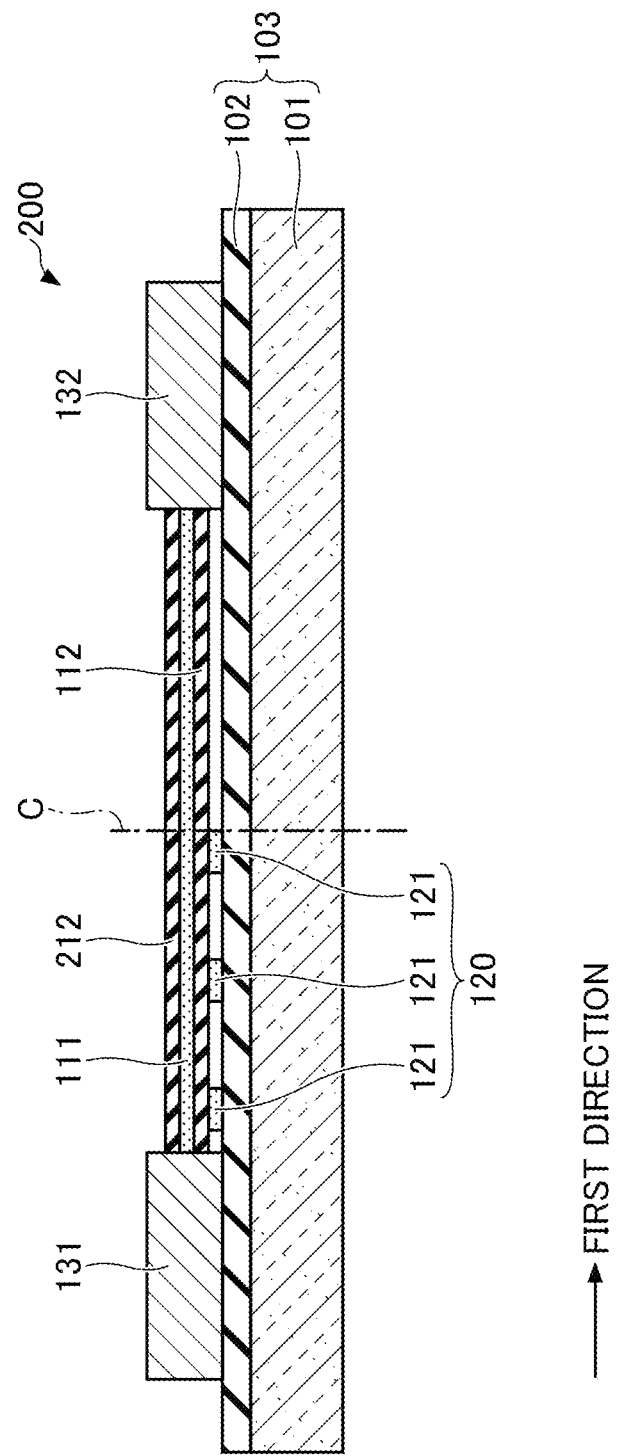

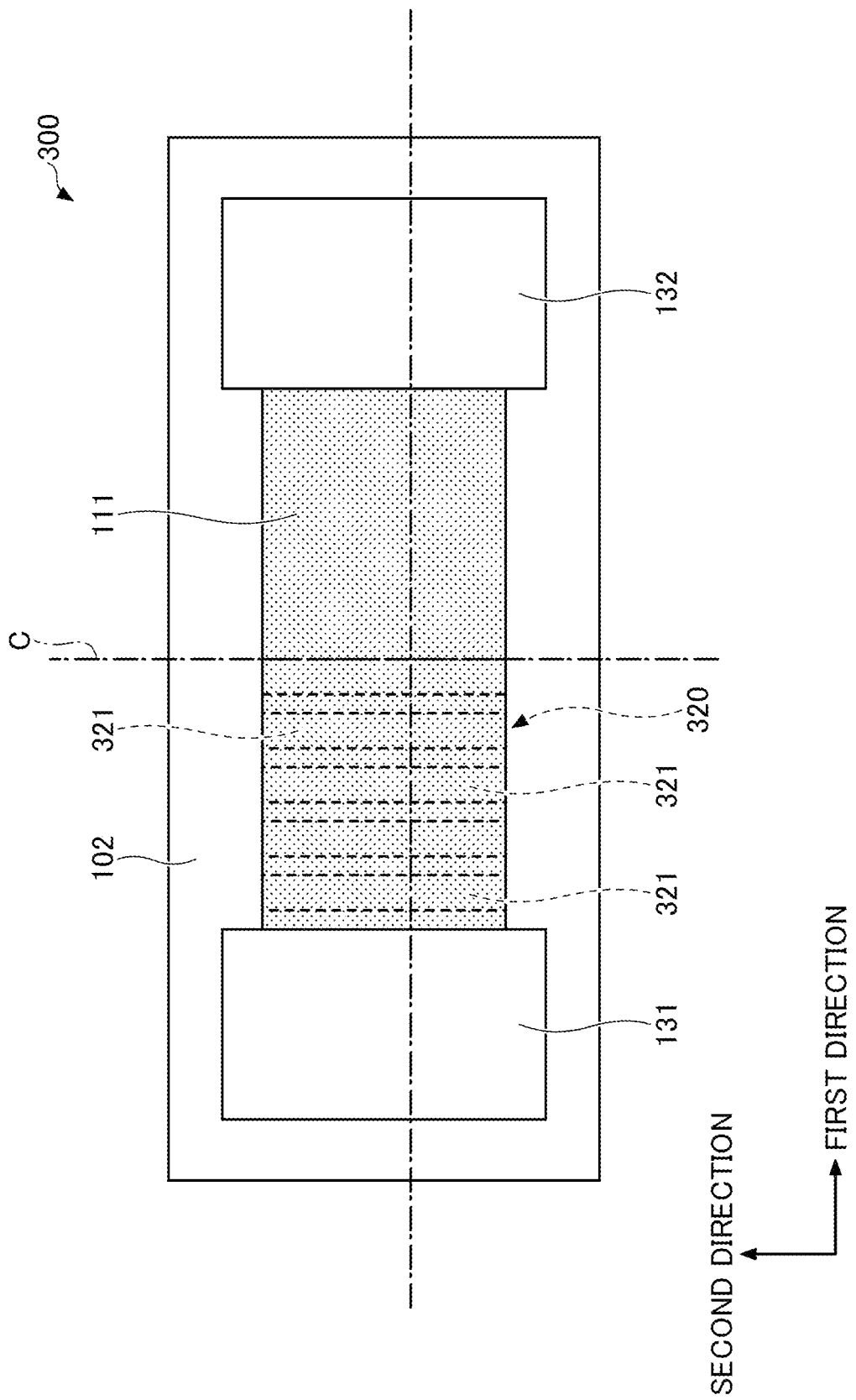

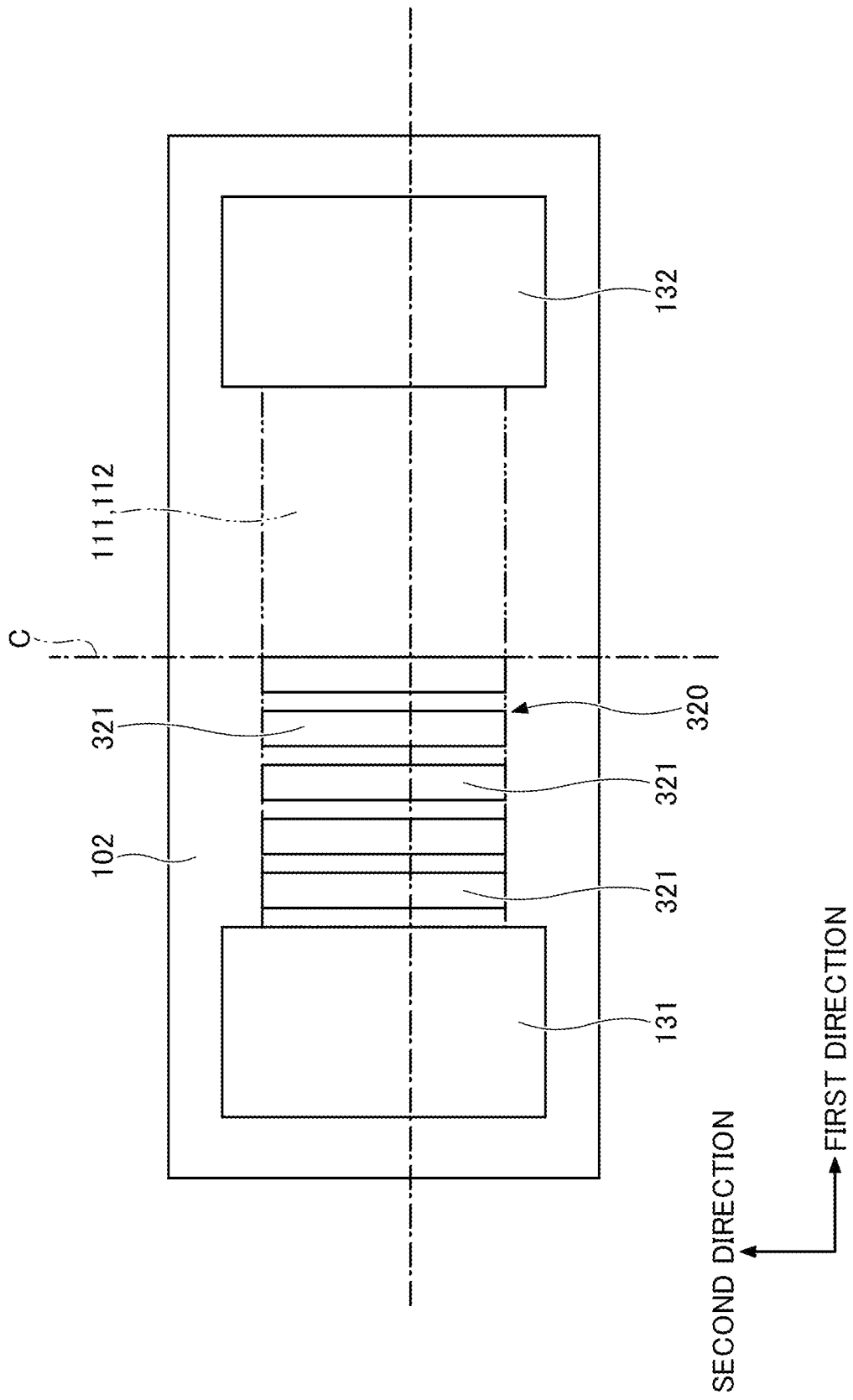

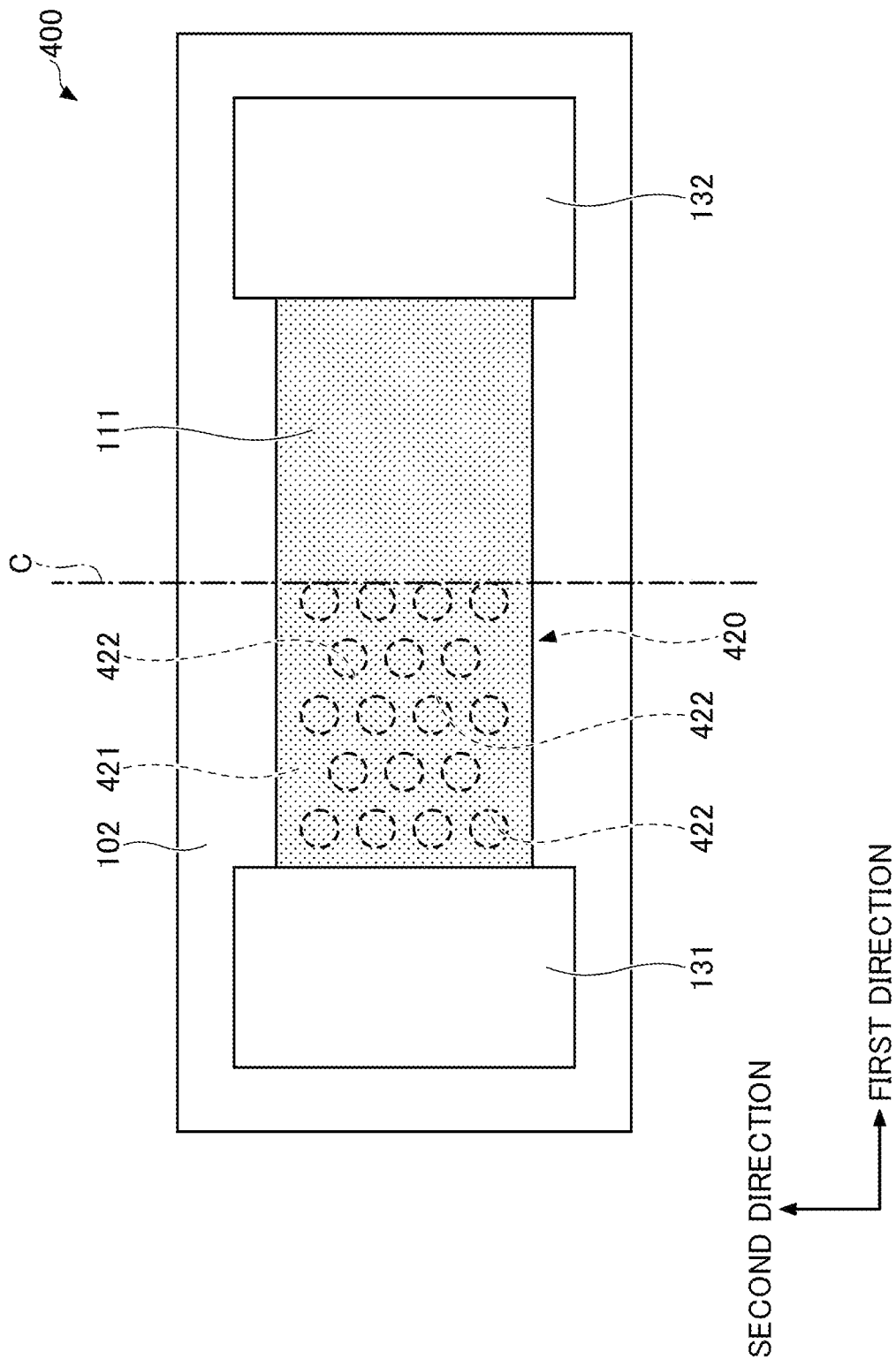

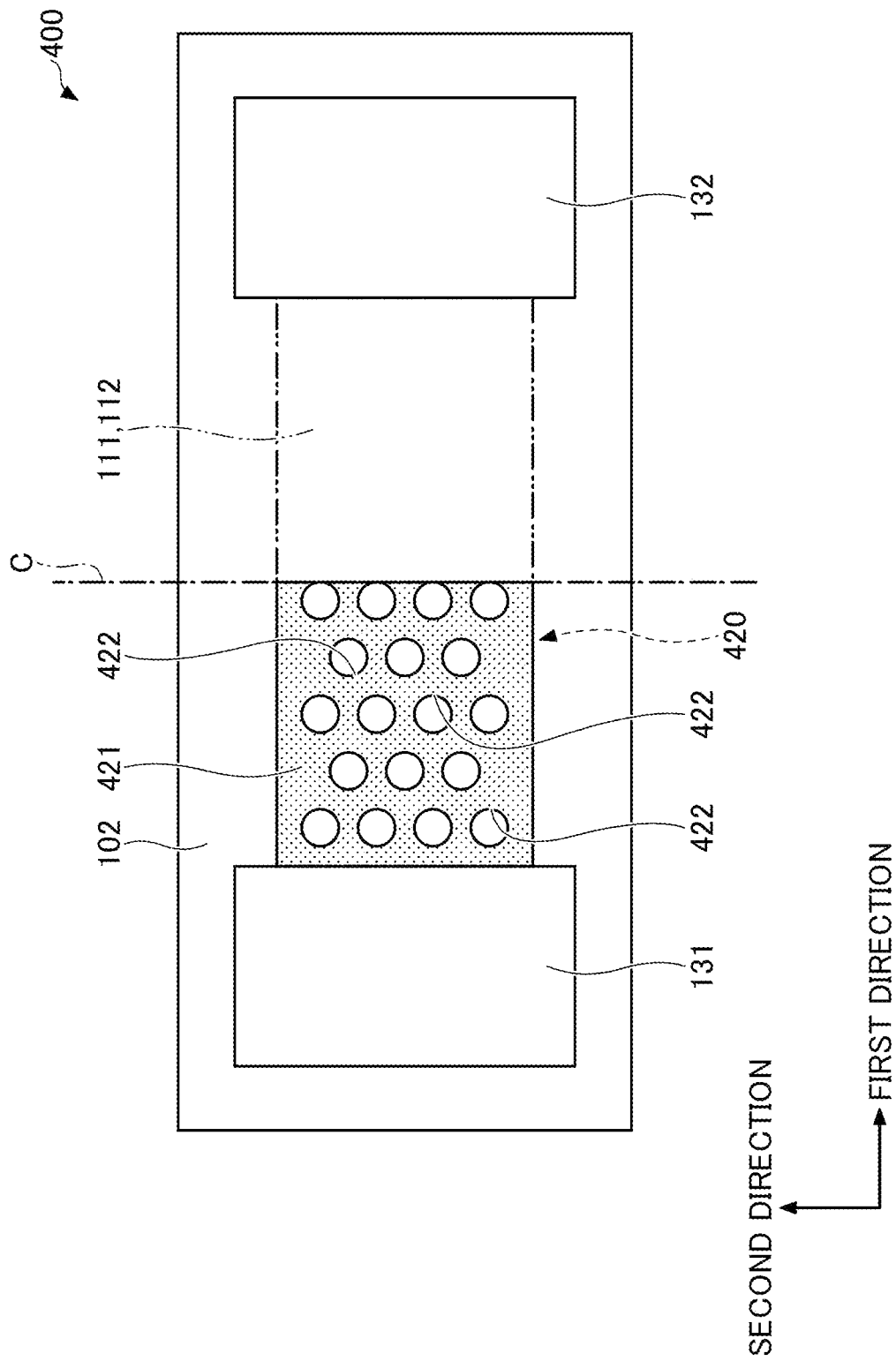

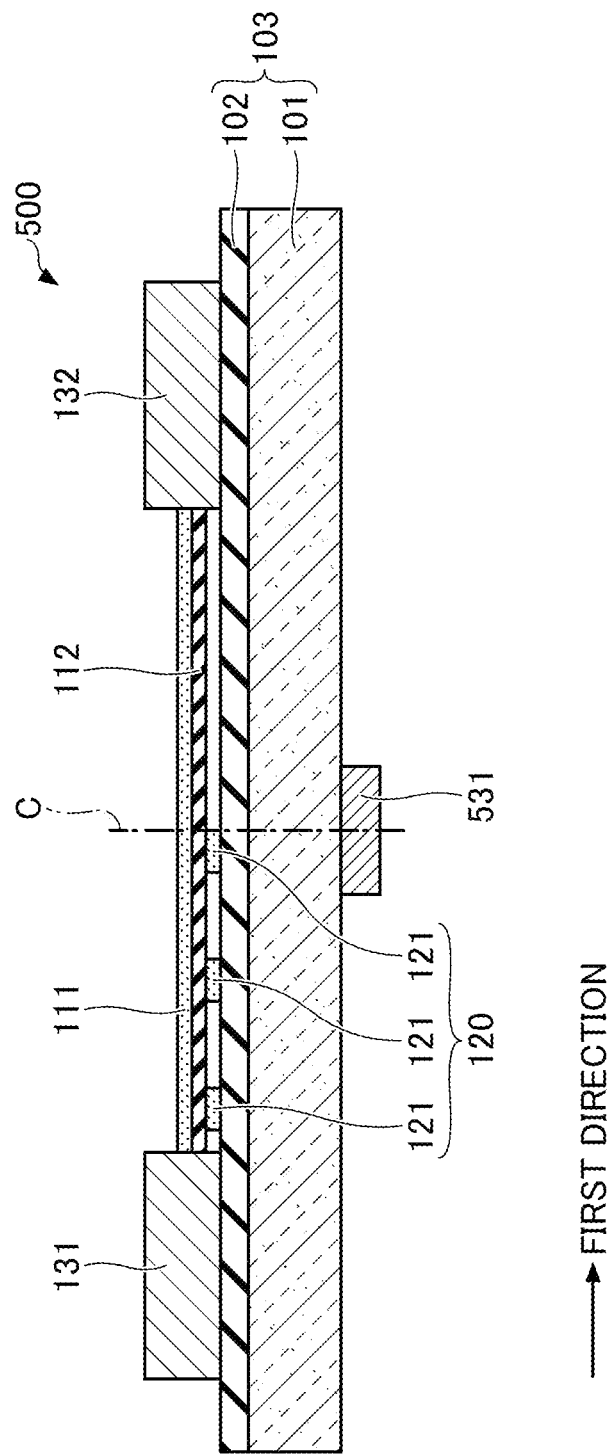

OPTICAL SENSOR AND METHOD FOR MANUFACTURING SAME

CROSS-REFERENCE TO RELATED APPLICATIONS

This application is based on and claims priority to Japanese Patent Application No. 2020-184853, filed on Nov. 5, 2020, the entire contents of which are incorporated herein by reference.

FIELD

The disclosures herein relate to an optical sensor and a method for manufacturing the same.

BACKGROUND

Layered crystals such as graphite have a structure in which atomic layers, serving as structural units, are regularly stacked in a direction normal to the atomic layers. Such graphite exhibits high light absorption, high electrical conductivity, and high flexibility, and thus, the application of graphite to transparent conductive films and flexible devices has been studied. Recently, it has been found that a single atomic layer (graphene), obtained by exfoliation from a bulk graphite crystal, exhibits novel properties, such as high carrier mobility, that are different from those of the bulk crystal. As a result, the development of devices using graphene has been promoted. In particular, by utilizing graphene's high carrier mobility and ability to absorb various wavelengths of light from visible to infrared (2.3% of light per monolayer), high-speed, high-sensitivity infrared sensors that operate at room temperature have been developed.

Although it is preferable to use monolayer graphene in order to utilize its excellent electrical properties (high carrier mobility) when manufacturing a graphene-based optical sensor, it may be difficult to obtain sufficient sensitivity because the amount of light that can be absorbed by the monolayer graphene is small. For this reason, a technique that increases the amount of light absorption of a sensor by subjecting graphene, serving as a light receiver, to antidot patterning (forming a large number of minute holes in graphene) has been suggested.

However, such antidot patterning of graphene decreases carrier mobility in proportion to the amount of the holes formed.

RELATED-ART DOCUMENTS

Patent Documents

Patent Document 1: Japanese Laid-open Patent Publication No. 2019-522348
Patent Document 2: Japanese Laid-open Patent Publication No. 2013-46028
Patent Document 3: Japanese Laid-open Patent Publication No. 2014-203929

Non-Patent Documents

Non-Patent Document 1: Dirac plasmon-assisted asymmetric hot carrier generation for room-temperature infrared detection, Nature Communications, 10, 3498 (2019)

Non-Patent Document 2: Wide Angle Dynamically Tunable Enhanced Infrared Absorption on Large-Area Nanopatterned Graphene, ACS Nano, 13, 421 (2019)

SUMMARY

According to an embodiment of the present disclosure, an optical sensor includes a graphene layer, a first electrode and a second electrode that are connected to the graphene layer, and an enhancement layer. The enhancement layer is disposed below the graphene layer to enhance the intensity of an optical electric field by surface plasmon resonance. The first electrode and the second electrode are arranged parallel to a first direction. The intensity of the optical electric field enhanced by the enhancement layer is greater on a first electrode side than on a second electrode side with respect to a centerline in the first direction of the graphene layer.

BRIEF DESCRIPTION OF DRAWINGS

Other objects and further features of the present invention will be apparent from the following detailed description when read in conjunction with the accompanying drawings, in which:

FIG. 12 is a cross-sectional view (part 1) illustrating a method for manufacturing the optical sensor according to the second embodiment;

FIG. 13 is a cross-sectional view (part 2) illustrating the method for manufacturing the optical sensor according to the second embodiment;

FIG. 14 is a cross-sectional view (part 3) illustrating the method for manufacturing the optical sensor according to the second embodiment;

FIG. 15 is a plan view of an optical sensor according to a third embodiment;

FIG. 16 is a perspective view of the optical sensor according to the third embodiment;

FIG. 17 is a plan view of an optical sensor according to a fourth embodiment;

FIG. 18 is a perspective view of the optical sensor according to the fourth embodiment; and FIG. 19 is a cross-sectional view of an optical sensor according to a fifth embodiment.

DESCRIPTION OF EMBODIMENTS

Figure 1:
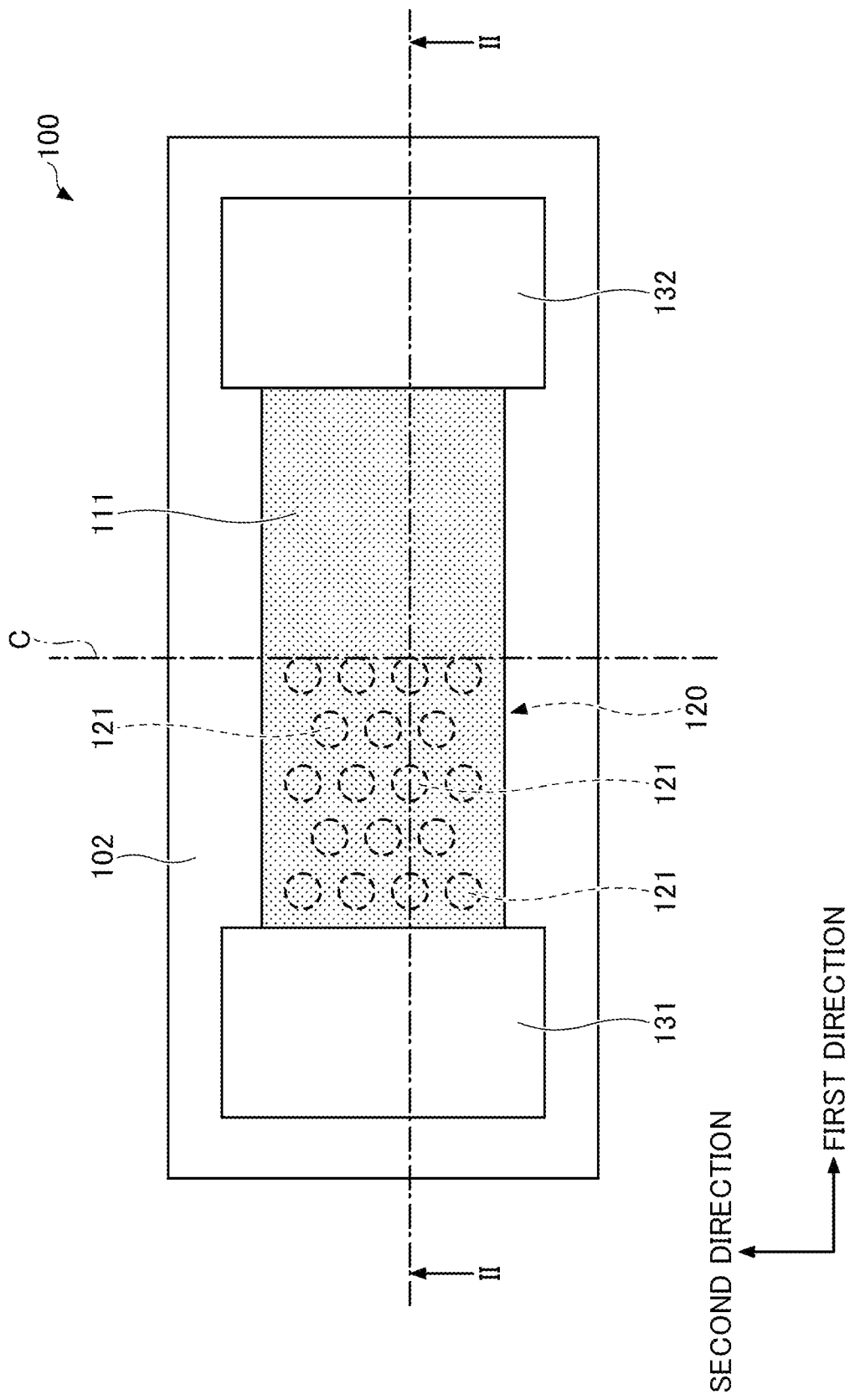
FIG. 1 is a plan view of an optical sensor according to a first embodiment.

According to at least one embodiment, sensitivity can be improved while suppressing a decrease in carrier mobility.

In the following, embodiments of the present invention will be described in detail with reference to the accompanying drawings. In the specification and drawings, elements having substantially the same functions or configurations are denoted by the same reference numerals, and a duplicate description thereof may be omitted.

First Embodiment

Figure 2:
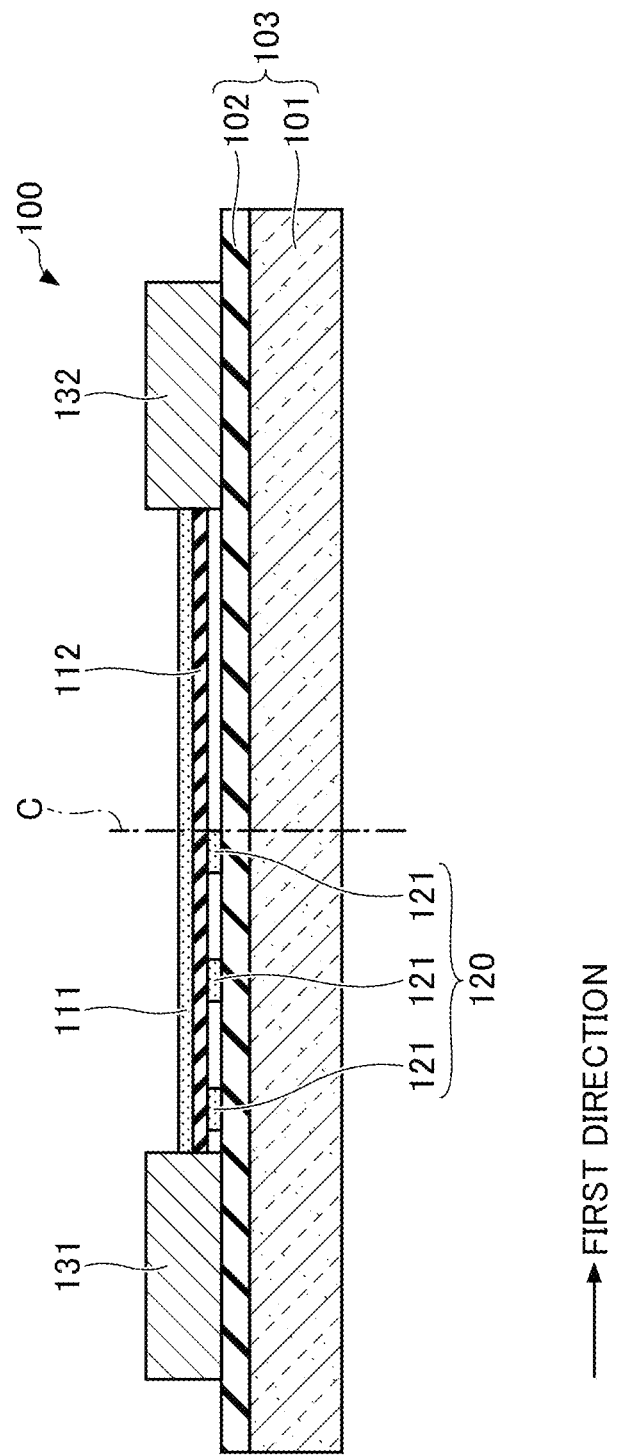
FIG. 2 is a cross-sectional view of the optical sensor according to the first embodiment.

First, a first embodiment will be described. The first embodiment relates to an optical sensor. FIG. 1 is a plan view of an optical sensor according to the first embodiment. FIG. 2 is a cross-sectional view of the optical sensor according to the first embodiment. FIG. 2 corresponds to a cross-sectional view taken through II-II of FIG. 1.

As illustrated in FIG. 1 and FIG. 2, an optical sensor 100 according to the first embodiment includes a base 103. The base 103 includes a silicon (Si) substrate 101 and a silicon oxide ($SiO_2$) film 102 that is formed on the surface of the substrate 101. The base 103 may be, for example, a Si substrate with a thermal oxide film. A first electrode 131 and a second electrode 132 are provided on the silicon oxide film 102. The first electrode 131 and the second electrode 132 are arranged parallel to a first direction. The material of each of the first electrode 131 and the second electrode 132 is not particularly limited, and may be Au, Pd, Ni, Cr, or Ti. Each of the first electrode 131 and the second electrode 132 may include a stack of these metals. For example, each of the first electrode 131 and the second electrode 132 may include a stack of a Ti film and an Au film that is formed on the Ti film, or may include a stack of a Cr film and an Au film that is formed on the Cr film. The material of the first electrode 131 and the material of the second electrode 132 may be the same or may be different.

An enhancement layer 120 that enhances the intensity of an optical electric field by surface plasmon resonance is provided between the first electrode 131 and the second electrode 132. The enhancement layer 120 will be described later.

A graphene layer 111 is provided above the enhancement layer 120, and is connected to the first electrode 131 and to the second electrode 132. The graphene layer 111 includes one or more stacked graphene layers. If the graphene layer 111 includes a plurality of graphene layers, the plurality of graphene layers are preferably twisted (randomly stacked). By twisting (randomly stacking) the graphene layers, relatively high carrier mobility can be obtained. Further, an insulating layer 112 is provided between the graphene layer 111 and the enhancement layer 120. The insulating layer 112 may be made of hexagonal boron nitride (hBN) that is a two-dimensional material. The insulating layer 112 includes one or more stacked hBN layers. The length (dimension in the first direction) and the width (dimension in a second direction perpendicular to the first direction) of each of the graphene layer 111 and the insulating layer 112 are not particularly limited, and may be approximately 1 μm to 1000 μm.

Next, the enhancement layer 120 will be described. In the present embodiment, the enhancement layer 120 includes a plurality of graphene dot portions 121. The graphene dot portions 121 are provided on the first electrode 131 side with respect to a centerline C in the first direction of the graphene layer 111, and the graphene dot portions 121 are not provided on the second electrode 132 side with respect to the centerline C of the graphene layer 111. That is, the density of the graphene dot portions 121 on the first electrode 131 side is higher than that on the second electrode 132 side with respect to the centerline C. Accordingly, the intensity of the optical electric field enhanced by the enhancement layer 120 is greater on the first electrode 131 side than on the second electrode 132 side with respect to the centerline C.

Each of the graphene dot portions 121 includes one or more stacked graphene layers. For example, the graphene dot portions 121 are arranged in an equilateral triangular lattice in plan view. The graphene dot portions 121 may be arranged in a square lattice in plan view. The shape of each of the graphene dot portions 121 in plan view is not particularly limited. Each of the graphene dot portions 121 may have a substantially circular shape or a substantially rectangular shape in plan view. In addition, the size of each of the graphene dot portions 121 in plan view is not particularly limited, and may be appropriately selected in accordance with the wavelength of an optical electric field to be enhanced. For example, in a case where an optical electric field in the mid-infrared region is to be enhanced, each of the graphene dot portions 121 has a substantially circular shape in plan view with a diameter of 100 nm to 200 nm, and the graphene dot portions 121 are regularly arranged with a period of 200 nm to 400 nm. As used herein, the period of the graphene dot portions 121 refers to the length of a line connecting the centers of the two closest graphene dot portions 121.

In the optical sensor 100 having the above-described configuration according to the first embodiment, when light is incident on the graphene layer 111, part of the light passes through the graphene layer 111 and the insulating layer 112, and reaches the enhancement layer 120. As described above, the graphene dot portions 121 are provided on the first electrode 131 side with respect to the centerline C, and are not provided on the second electrode 132 side with respect to the centerline C. Accordingly, the intensity of the optical electric field is enhanced near the graphene dot portions 121 on the first electrode 131 side, and is not enhanced on the second electrode 132 side with respect to the centerline C. That is, the intensity of the optical electric field enhanced by the enhancement layer 120 is greater on the first electrode 131 side than on the second electrode 132 side with respect to the centerline C. Therefore, the amount of light absorbed by the graphene layer 111 is greater on the first electrode 131 side than on the second electrode 132 with respect to the centerline C. As a result, the density of optically excited carriers becomes different between the first electrode 131 side and the second electrode 132 side with respect to the centerline C of the graphene layer 111, and thus, a potential difference (voltage) is generated between the first electrode 131 and the second electrode 132. By measuring the potential difference (voltage), incident light can be detected.

Further, the graphene layer 111 is not necessarily subjected to any treatment that may decrease carrier mobility, such as antidot patterning. Accordingly, the sensitivity can be improved while suppressing a decrease in carrier mobility.

The amount of enhancement of the optical electric field by graphene dots is greater than that of antidot-patterned graphene. For example, while the amount of light absorbed by graphene without antidot patterning is approximately 2.3%, the amount of light absorbed by antidot-patterned graphene is approximately 60%. In contrast, the amount of light absorbed by graphene dots is approximately 90%. As will be described later, antidot-patterned graphene may be used for the enhancement layer 120.

Further, because the insulating layer 112 is provided between the graphene dot portions 121 and the graphene layer 111, the influence of carrier scattering on the graphene layer 111 by the graphene dot portions 121 can be suppressed. The intensity of the optical electric field to be enhanced is attenuated exponentially with the distance between the graphene dot portions 121 and the graphene layer 111. Therefore, the insulating layer 112 is preferably thin. For example, the insulating layer 112 is preferably composed of one hBN layer. The material of the insulating layer 112 is not limited to hBN. For example, aluminum oxide ($Al_2O_3$) or hafnium oxide ($HfO_2$) may be used as the material of the insulating layer 112.

The wavelength of the optical electric field to be enhanced depends on the size and the period of the graphene dot portions 121 of the enhancement layer 120. Therefore, the wavelength of the optical electric field to be enhanced can be modulated by adjusting the size and the period of the graphene dot portions 121. For example, the wavelength of the optical electric field to be enhanced can be modulated in a range of approximately 8 μm to 10 μm by setting the diameter to 100 nm to 200 nm and the period to 200 nm to 400 nm.

Next, a method for manufacturing the optical sensor 100 according to the first embodiment will be described. FIG. 3 through FIG. 8 are cross-sectional views illustrating a method for manufacturing the optical sensor 100 according to the first embodiment. FIG. 9 is a plan view illustrating the method for manufacturing the optical sensor 100 according to the first embodiment. FIG. 4 corresponds to a cross-sectional view taken through IV-IV of FIG. 9.

Figure 3:
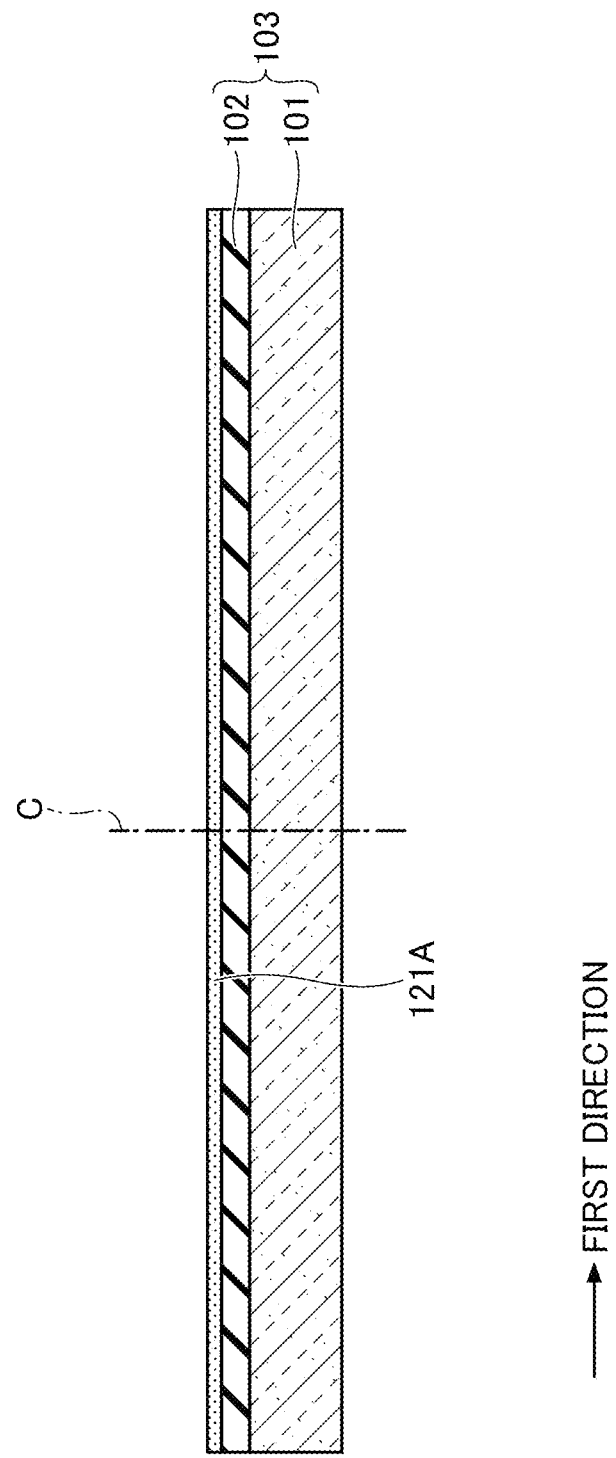
FIG. 3 is a cross-sectional view (part 1) illustrating a method for manufacturing the optical sensor according to the first embodiment.
Figure 4:
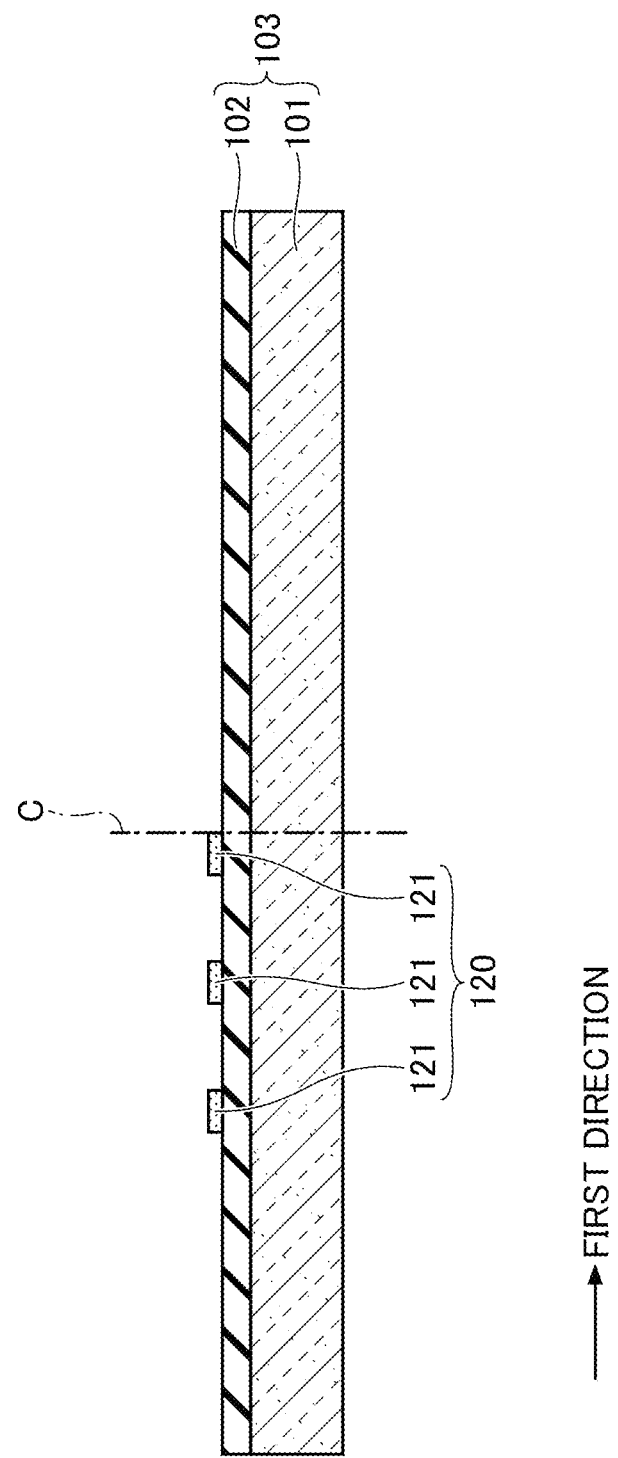
FIG. 4 is a cross-sectional view (part 2) illustrating the method for manufacturing the optical sensor according to the first embodiment.

As illustrated in FIG. 3, a base 103 is prepared first. The base 103 is, for example, a Si substrate with a thermal oxide film. Next, a graphene layer 121A is formed on a silicon oxide film 102. The graphene layer 121A is formed so as to cover at least a region where a plurality of graphene dot portions 121 are to be formed. The graphene layer 121A may be synthesized directly on the silicon oxide film 102. Alternatively, the graphene layer 121A may be separately synthesized, and the synthesized graphene layer 121A may be transferred onto the silicon oxide film 102.

Subsequently, as illustrated in FIG. 4 and FIG. 9, the graphene layer 121A is processed such that the plurality of graphene dot portions 121 constituting an enhancement layer 120 are formed. For example, when the graphene layer 121A is processed, lithography is used to form a mask that covers portions where the plurality of graphene dot portions 121 are to be formed, and portions of the graphene layer 121A exposed from the mask are removed by ashing using oxygen plasma or the like.

Figure 5:
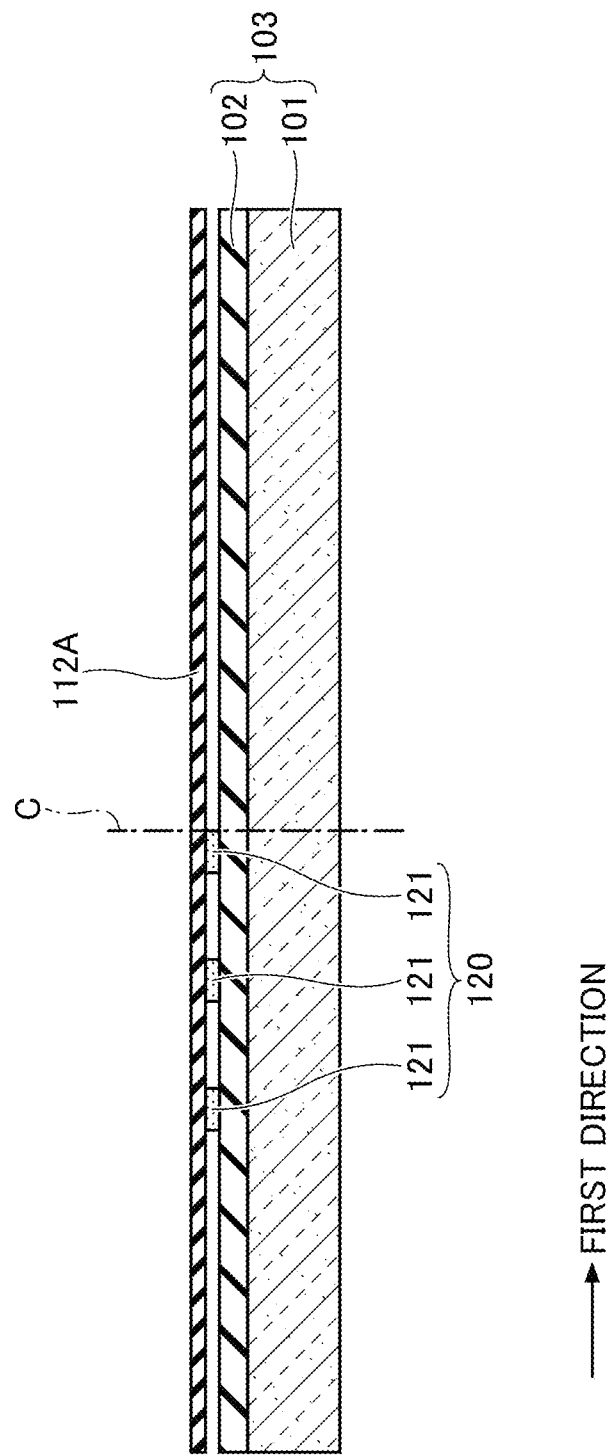
FIG. 5 is a cross-sectional view (part 3) illustrating the method for manufacturing the optical sensor according to the first embodiment.

Next, as illustrated in FIG. 5, an insulating layer 112A is formed on the enhancement layer 120. The insulating layer 112A is made of, for example, hexagonal boron nitride (hBN) that is a two-dimensional material. The insulating layer 112A is formed so as to cover at least a region where an insulating layer 112 is to be formed. The insulating layer 112A may be separately synthesized and transferred onto the enhancement layer 120. Alternatively, the insulating layer 112A may be directly synthesized on the insulating layer 112A. As the material of the insulating layer 112A, aluminum oxide or hafnium oxide may be used. If aluminum oxide or hafnium oxide is used as the material of the insulating layer 112A, the insulating layer 112A may be formed by atomic layer deposition (ALD), vapor deposition, or the like.

Figure 6:
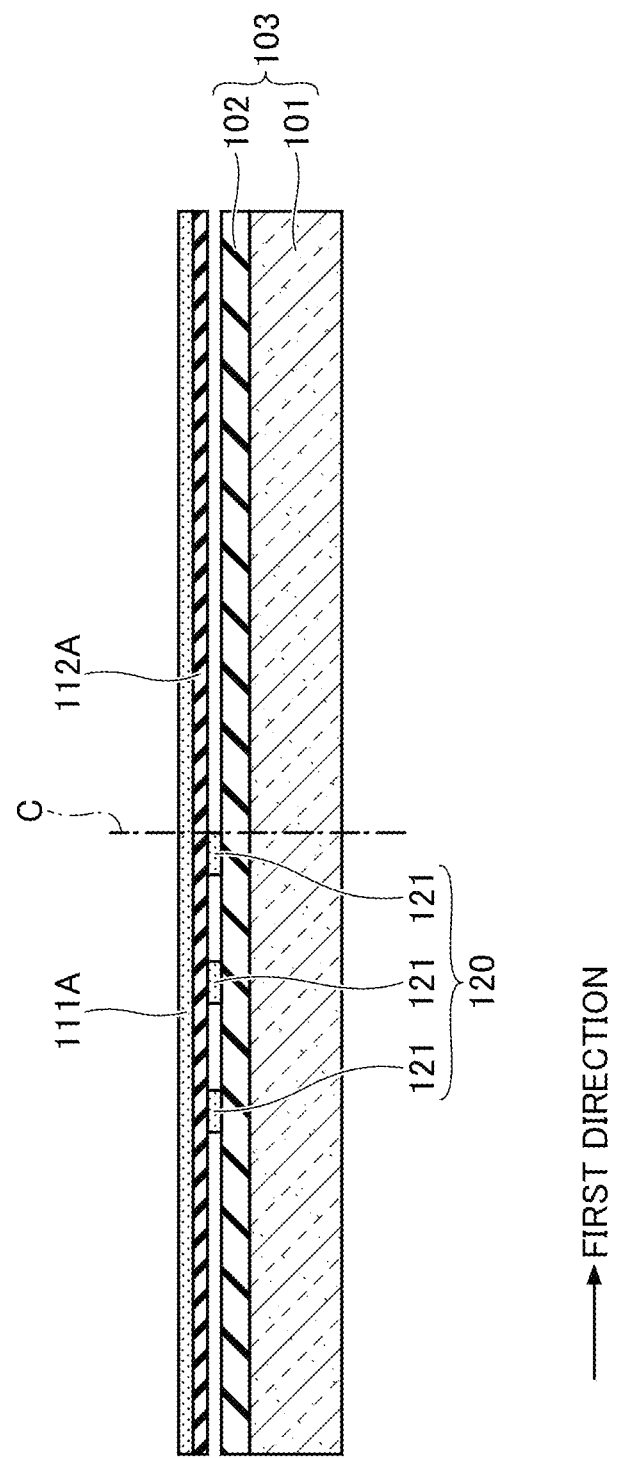
FIG. 6 is a cross-sectional view (part 4) illustrating the method for manufacturing the optical sensor according to the first embodiment.

Next, as illustrated in FIG. 6, a graphene layer 111A is formed on the insulating layer 112A. The graphene layer 111A is formed so as to cover at least a region where a graphene layer 111 is to be formed. The graphene layer 111A may be directly synthesized on the insulating layer 112A. Alternatively, the graphene layer 111A may be separately synthesized and transferred onto the insulating layer 112A.

Figure 7:
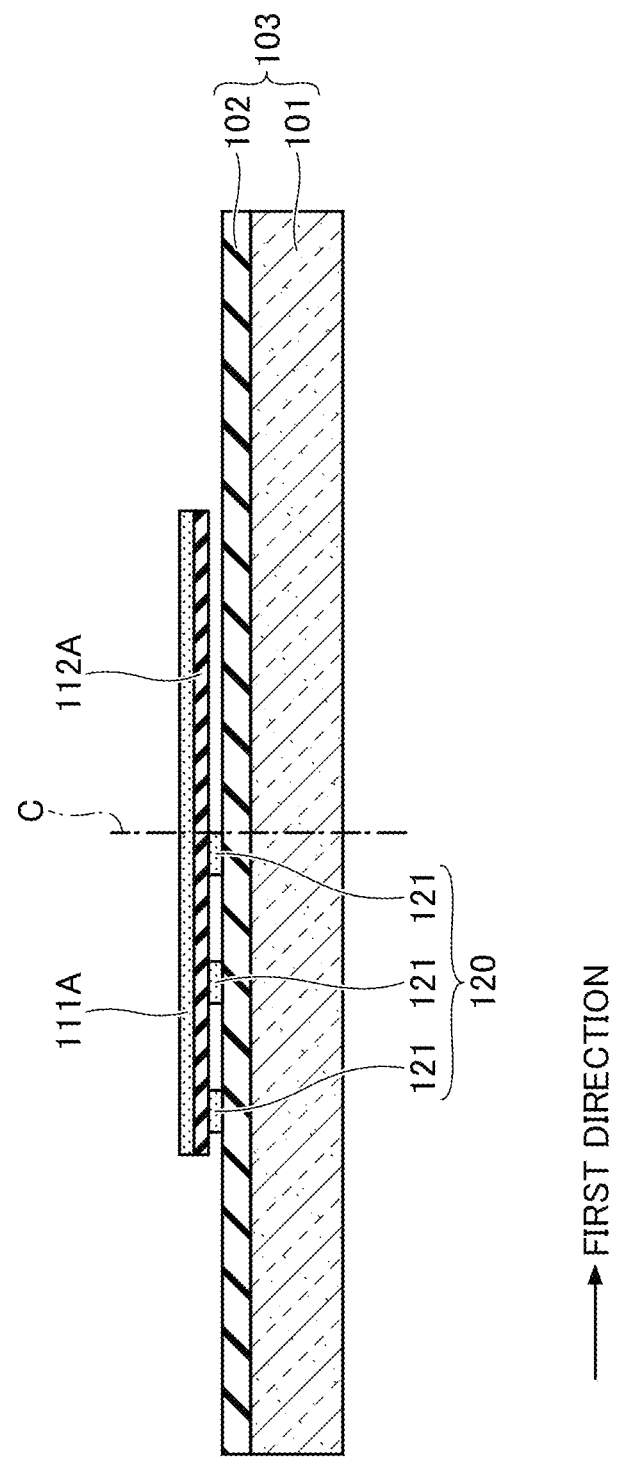
FIG. 7 is a cross-sectional view (part 5) illustrating the method for manufacturing the optical sensor according to the first embodiment.

Subsequently, as illustrated in FIG. 7, the graphene layer 111A and the insulating layer 112A are processed such that the graphene layer 111 and the insulating layer 112 are formed. For example, when the graphene layer 111A and the insulating layer 112A are processed, lithography is used to form a mask that covers portions where the graphene layer 111 and the insulating layer 112 are to be formed, and portions of the graphene layer 111A and the insulating layer 112A exposed from the mask are removed by ashing using oxygen plasma or the like. Instead of ashing using oxygen plasma or the like, reactive ion etching (RIE) may be performed.

Figure 8:
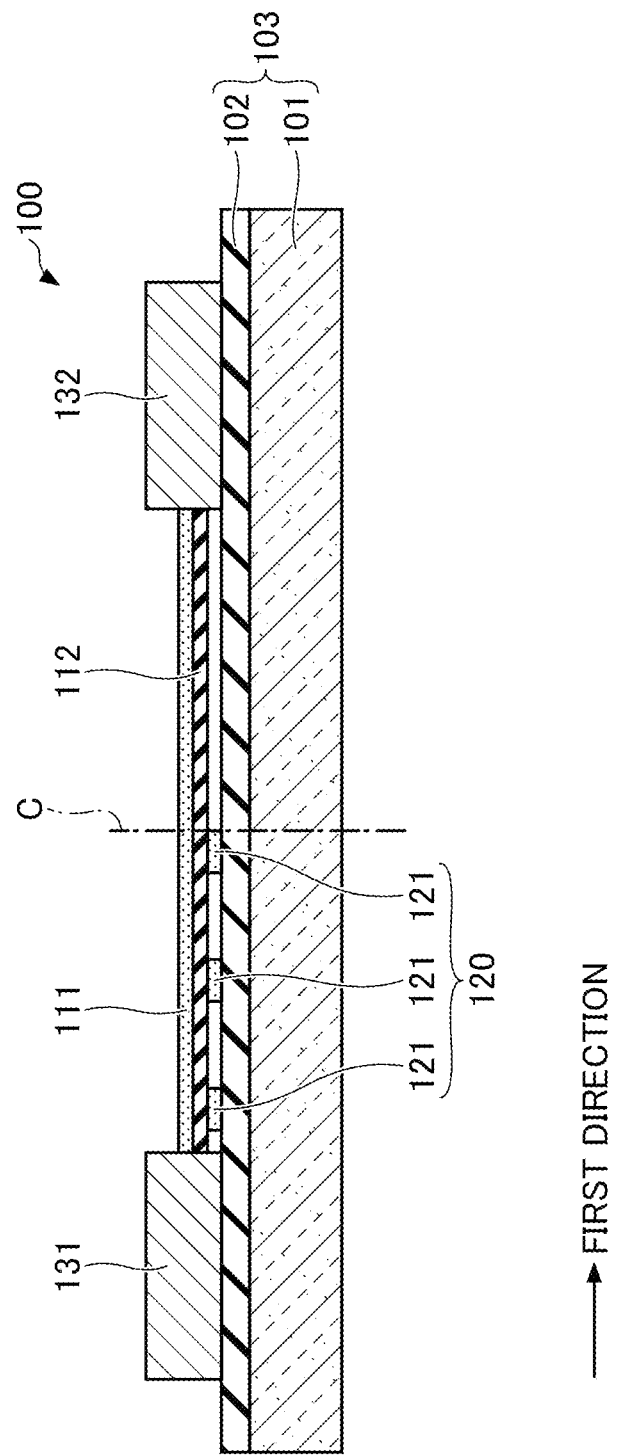
FIG. 8 is a cross-sectional view (part 6) illustrating the method for manufacturing the optical sensor according to the first embodiment.
Figure 9:
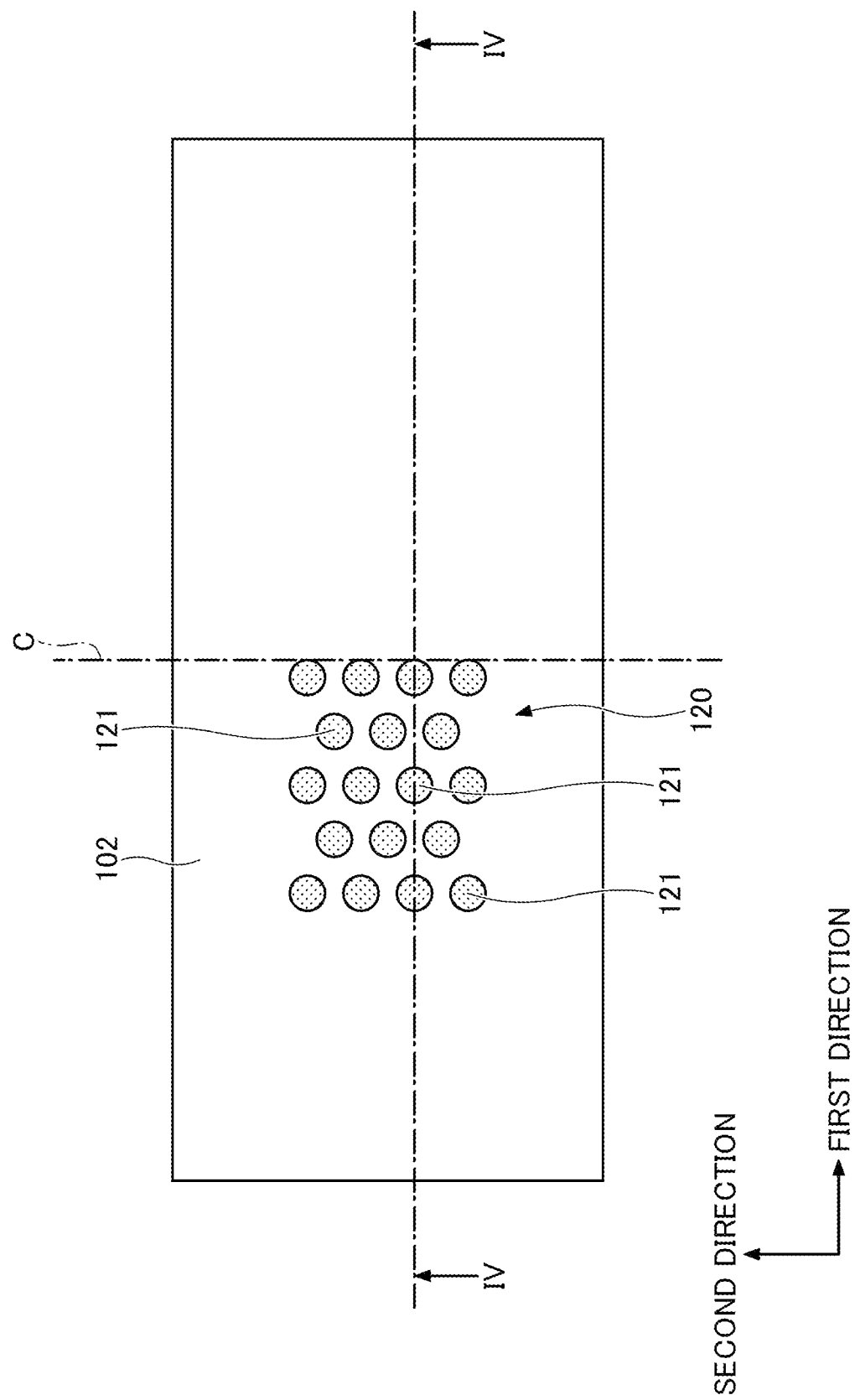
FIG. 9 is a plan view illustrating the method for manufacturing the optical sensor according to the first embodiment.

Next, as illustrated in FIG. 8, a first electrode 131 and a second electrode 132 are formed so as to be connected to the graphene layer 111. The first electrode 131 and the second electrode 132 are arranged in parallel to the first direction.

In this manner, the optical sensor 100 according to the first embodiment can be manufactured.

Second Embodiment

Figure 10:
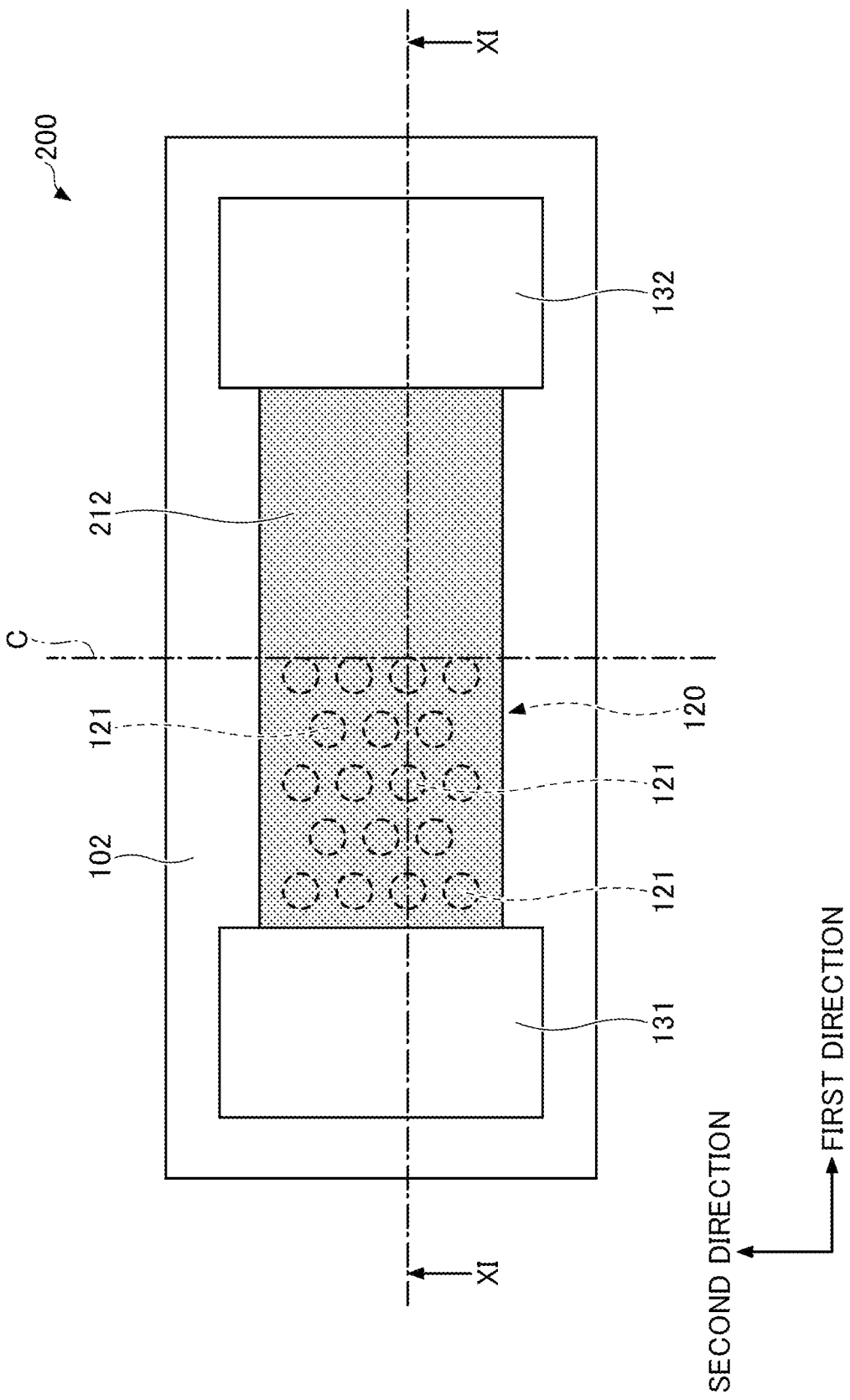
FIG. 10 is a plan view of an optical sensor according to a second embodiment.
Figure 11:
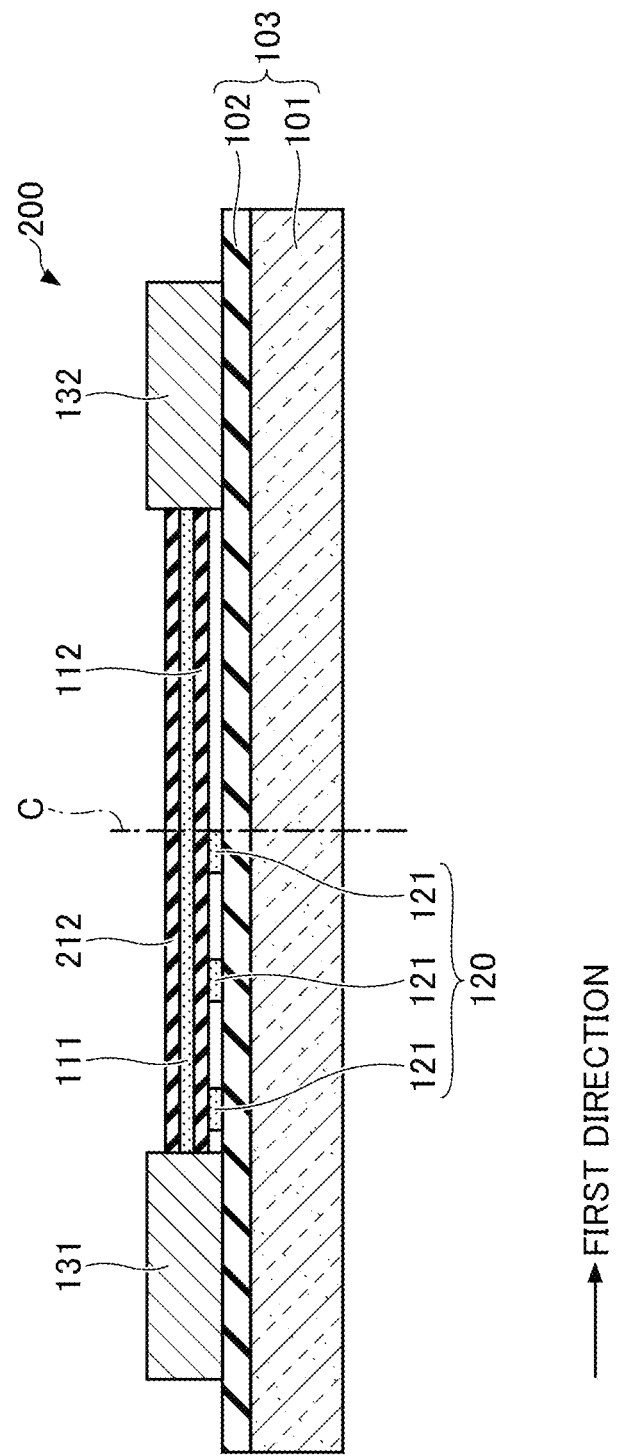
FIG. 11 is a cross-sectional view of the optical sensor according to the second embodiment.

Next, a second embodiment will be described. The second embodiment differs from the first embodiment in that a passivation layer is provided on the graphene layer 111. FIG. 10 is a plan view of an optical sensor according to the second embodiment. FIG. 11 is a cross-sectional view of the optical sensor according to the second embodiment. FIG. 11 corresponds to a cross-sectional view taken through XI-XI of FIG. 10.

As illustrated in FIG. 10 and FIG. 11, an optical sensor 200 according to the second embodiment includes a passivation layer 212 on the graphene layer 111. The passivation layer 212 is made of, for example, hexagonal boron nitride (hBN) that is a two-dimensional material. The passivation layer 212 includes one or more stacked hBN layers.

Other configurations are the same as those of the first embodiment.

Accordingly, in the second embodiment, the sensitivity can be improved while suppressing a decrease in carrier mobility. Further, in the second embodiment, because the passivation layer 212 is formed, adsorption of moisture in the air by the graphene layer 111 can be suppressed. If the graphene layer 111 adsorbs moisture, the properties of the graphene layer 111 would change due to moisture doping. In the second embodiment, the graphene layer 111 is covered by the passivation layer 212, the properties of the graphene layer 111 can be stabilized.

The material of the passivation layer 212 is not limited to hBN. As the material of the passivation layer 212, aluminum oxide or hafnium oxide may be used, for example.

Next, a method for manufacturing the optical sensor 200 according to the second embodiment will be described. FIG. 12 through FIG. 14 are cross-sectional views illustrating a method for manufacturing the optical sensor 200 according to the second embodiment.

First, in the same manner as in the first embodiment, the process as of the formation of the graphene layer 111A is performed (see FIG. 6). Next, as illustrated in FIG. 12, a passivation layer 212A is formed on the graphene layer 111A. The passivation layer 212A is made of, for example, hexagonal boron nitride (hBN) that is a two-dimensional material. The passivation layer 212A is formed so as to at least cover a region where a passivation layer 212 is to be formed. The passivation layer 212A may be separately synthesized and transferred onto the graphene layer 111A. Alternatively, the passivation layer 212A may be directly synthesized on the graphene layer 111A. As the material of the passivation layer 212A, aluminum oxide or hafnium oxide may be used. If aluminum oxide or hafnium oxide is used as the material of the passivation layer 212A, the passivation layer 212A may be formed by ALD, vapor deposition, or the like.

Subsequently, as illustrated in FIG. 13, the passivation layer 212A, the graphene layer 111A, and the insulating layer 112A are processed such that the passivation layer 212, the graphene layer 111, and the insulating layer 112 are formed. For example, when the passivation layer 212A, the graphene layer 111A, and the insulating layer 112A are processed, lithography is used to form a mask that covers portions where the passivation layer 212, the graphene layer 111, and the insulating layer 112 are to be formed, and portions of the passivation layer 212A, the graphene layer 111A, and the insulating layer 112A exposed from the mask are removed by ashing using oxygen plasma or the like. Instead of ashing using oxygen plasma or the like, RIE may be performed.

Next, as illustrated in FIG. 14, a first electrode 131 and a second electrode 132 are formed so as to be connected to the graphene layer 111. The first electrode 131 and the second electrode 132 are arranged in parallel to the first direction.

In this manner, the optical sensor 200 according to the second embodiment can be manufactured.

Third Embodiment

Next, a third embodiment will be described. In the third embodiment, the configuration of an enhancement layer differs from that of the first embodiment. FIG. 15 is a plan view of an optical sensor according to the third embodiment. FIG. 16 is a perspective view of the optical sensor according to the third embodiment. In FIG. 16, the graphene layer 111 and the insulating layer 112 are illustrated as being transparent.

As illustrated in FIG. 15 and FIG. 16, an optical sensor 300 according to the third embodiment includes an enhancement layer 320 instead of the enhancement layer 120. The enhancement layer 320 includes a plurality of linear graphene portions 321. The linear graphene portions 321 are provided on the first electrode 131 side with respect to the centerline C of the graphene layer 111, and the linear graphene portions 321 are not provided on the second electrode 132 side with respect to the centerline C of the graphene layer 111. Accordingly, the intensity of an optical electric field enhanced by the enhancement layer 320 is greater on the first electrode 131 side than on the second electrode 132 side with respect to the centerline C.

Each of the linear graphene portions 321 includes one or more stacked graphene layers. The linear graphene portions 321 extend in the second direction perpendicular to the first direction, and are arranged parallel to the first direction. The size of each of the linear graphene portions 321 is not particularly limited, and can be selected in accordance with the wavelength of an optical electric field to be enhanced.

Other configurations are the same as those of the first embodiment.

Accordingly, in the third embodiment, the sensitivity can be improved while suppressing a decrease in carrier mobility. Further, in the third embodiment, a mask for forming the enhancement layer 320 can be easily designed and created.

Fourth Embodiment

Next, a fourth embodiment will be described. In the fourth embodiment, the configuration of an enhancement layer differs from that of the first embodiment. FIG. 17 is a plan view of an optical sensor according to the fourth embodiment. FIG. 18 is a perspective view of the optical sensor according to the fourth embodiment. In FIG. 18, the graphene layer 111 and the insulating layer 112 are illustrated as being transparent.

As illustrated in FIG. 17 and FIG. 18, an optical sensor 400 according to the fourth embodiment includes an enhancement layer 420 instead of the enhancement layer 120. The enhancement layer 420 includes an antidot-patterned graphene layer 421. The graphene layer 421 is provided on the first electrode 131 side with respect to the centerline C of the graphene layer 111, and the graphene layer 421 is not provided on the second electrode 132 side with respect to the centerline C. Accordingly, the intensity of an optical electric field enhanced by the enhancement layer 420 is greater on the first electrode 131 side than on the second electrode 132 side of the centerline C.

The graphene layer 421 includes one or more stacked graphene layers. A plurality of openings 422 are formed in the graphene layer 421 by antidot patterning. The shape of each of the openings 422 is not particularly limited. Each of the openings 422 may have a substantially circular shape or a substantially rectangular shape. The size of each of the openings 422 is not particularly limited and may be appropriately selected in accordance with the wavelength of an optical electric field to be enhanced.

Accordingly, in the fourth embodiment, the sensitivity can be improved while suppressing a decrease in carrier mobility.

Fifth Embodiment

Next, a fifth embodiment will be described. The fifth embodiment differs from the first embodiment in that a control electrode is provided. FIG. 19 is a cross-sectional view of an optical sensor according to the fifth embodiment.

As illustrated in FIG. 19, an optical sensor 500 according to the fifth embodiment includes a gate electrode 531 that modulates the carrier concentration of the graphene layer 111. The gate electrode 531 is an example of the control electrode. For example, the gate electrode 531 is provided below the silicon substrate 101. That is, the optical sensor 500 has a back-gate structure. The gate electrode 531 can modulate not only the carrier concentration of the graphene layer 111, but also the carrier concentration of the graphene dot portions 121.

Other configurations are the same as those of the first embodiment.

Accordingly, in the fifth embodiment, the sensitivity can be improved while suppressing a decrease in carrier mobility. Further, in the fifth embodiment, the gate electrode 531 can modulate the wavelength of an optical electric field to be enhanced by modulating the carrier concentration of the graphene layer 111 and the carrier concentration of the graphene dot portions 121.

The gate electrode 531 may be provided in the optical sensors according to the second embodiment, the third embodiment and the fourth embodiment.

The configurations of the enhancement layer are not limited to those of the above-described embodiments. For example, the boundary between a region where graphene portions constituting the enhancement layer are provided and a region where graphene portions are not provided need not coincide with the centerline C in plan view. Further, the number of graphene portions provided on the second electrode 132 side is not necessarily zero. For example, if the intensity of an optical electric field to be enhanced is greater on the first electrode 131 side than on the second electrode 132 side, graphene portions may also be provided on the second electrode 132 side with respect to the centerline C. That is, the boundary between a region where graphene portions constituting the enhancement layer are provided and a region where graphene portions are not provided may be located on the second electrode 132 side with respect to the centerline C. Conversely, the boundary between a region where graphene portions are provided and a region where graphene portions are not provided may be located on the first electrode 131 side with respect to the centerline C. Further, a plurality of graphene dot portions may be provided on the second electrode 132 side at a density lower than that on the first electrode 131 side.

Further, hBN may be provided between the graphene constituting enhancement layer 120 and the silicon oxide film 102. By providing hBN, doping from the silicon oxide film to the graphene constituting the enhancement layer can be suppressed.

Further, the base 103 is not limited to a stack of the silicon substrate 101 and the silicon oxide film 102.

Although the embodiments of the present invention have been described in detail, the present invention is not limited to the above-described embodiments. Variations and modifications may be made without departing from the scope of the present invention described in the claims.

What is claimed is:

1. An optical sensor comprising:
   a graphene layer;
   a first electrode and a second electrode that are connected to the graphene layer; and
   an enhancement layer disposed below the graphene layer to enhance an intensity of an optical electric field by surface plasmon resonance,
   wherein the first electrode and the second electrode are arranged parallel to a first direction, and
   wherein the intensity of the optical electric field enhanced by the enhancement layer is greater on a first electrode side than on a second electrode side with respect to a centerline in the first direction of the graphene layer, and
   wherein the enhancement layer includes a plurality of graphene dot portions, and a density of the plurality of graphene dot portions is higher on the first electrode side than on the second electrode side with respect to the centerline.

2. An optical sensor comprising:
   a graphene layer;
   a first electrode and a second electrode that are connected to the graphene layer; and
   an enhancement layer disposed below the graphene layer to enhance an intensity of an optical electric field by surface plasmon resonance,
   wherein the first electrode and the second electrode are arranged parallel to a first direction, and
   wherein the intensity of the optical electric field enhanced by the enhancement layer is greater on a first electrode side than on a second electrode side with respect to a centerline in the first direction of the graphene layer, and
   wherein the enhancement layer includes a plurality of graphene dot portions solely on the first electrode side with respect to the centerline.

3. The optical sensor according to claim 1, wherein each of the graphene dot portions has a circular shape with a diameter of 100 nm to 200 nm in plan view, and the graphene dot portions are regularly arranged with a period of 200 nm to 400 nm.

4. The optical sensor according to claim 1, further comprising an insulating layer between the graphene layer and the enhancement layer.

5. The optical sensor according to claim 4, wherein the insulating layer includes hexagonal boron nitride.

6. The optical sensor according to claim 1, further comprising a passivation layer on the graphene layer.

7. The optical sensor according to claim 6, wherein the passivation layer includes hexagonal boron nitride.

8. The optical sensor according to claim 1, further comprising a control electrode that modulates a carrier concentration of the graphene layer.

9. A method for manufacturing an optical sensor, the method comprising:
   forming, on a base, an enhancement layer that enhances an intensity of an optical electric field by surface plasmon resonance;
   forming a graphene layer above the enhancement layer; and
   forming a first electrode and a second electrode so as to be connected to the graphene layer and arranged parallel to a first direction,
   wherein the intensity of the optical electric field enhanced by the enhancement layer is greater on a first electrode side than on a second electrode side with respect to a centerline in the first direction of the graphene layer, and
   wherein the enhancement layer includes a plurality of graphene dot portions, and a density of the plurality of graphene dot portions is higher on the first electrode side than on the second electrode side with respect to the centerline.

10. The optical sensor according to claim 2, wherein each of the graphene dot portions has a circular shape with a diameter of 100 nm to 200 nm in plan view, and the graphene dot portions are regularly arranged with a period of 200 nm to 400 nm.

11. The optical sensor according to claim 2, further comprising an insulating layer between the graphene layer and the enhancement layer.

12. The optical sensor according to claim 11, wherein the insulating layer includes hexagonal boron nitride.

13. The optical sensor according to claim 2, further comprising a passivation layer on the graphene layer.

14. The optical sensor according to claim 13, wherein the passivation layer includes hexagonal boron nitride.

15. The optical sensor according to claim 2, further comprising a control electrode that modulates a carrier concentration of the graphene layer.

* * * * *